United States Patent
Pueschner et al.

(12) 
(10) Patent No.: US 6,313,524 B1
(45) Date of Patent: Nov. 6, 2001

(54) CHIP MODULE WITH A PLURALITY OF FLAT CONTACT ELEMENTS MOUNTABLE ON EITHER AN EXTERNAL PRINTED CIRCUIT BOARD OR AN EXTERNAL CIRCUIT BOARD SUBSTRATE

(75) Inventors: Frank Pueschner, Kelheim; Michael Huber, Nittendorf/Undorf; Peter Stampka, Schwandorf-Klardorf; Jürgen Fischer, Deuerling; Josef Heitzer, Bach, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/274,506

(22) Filed: Mar. 23, 1999

Related U.S. Application Data

(63) Continuation of application No. PCT/DE97/01805, filed on Aug. 21, 1997.

(30) Foreign Application Priority Data

Sep. 23, 1996 (DE) .............................................. 196 39 025

(51) Int. Cl.[7] .......................... H01L 23/28; H01L 23/34; H05K 7/20
(52) U.S. Cl. .......................... 257/698; 257/702; 257/711; 257/666; 257/676; 257/691; 257/696; 257/690; 257/695; 257/668; 29/588; 29/841; 29/856
(58) Field of Search ..................................... 257/690, 666, 257/676, 685, 686, 691–693, 696, 698, 711, 668, 702; 29/856, 589, 588, 841

(56) References Cited

U.S. PATENT DOCUMENTS

| | | |
|---|---|---|
| 3,517,438 | 6/1970 | Johnson et al. . |
| 4,636,580 * | 1/1987 | Neidig et al. .......................... 361/388 |
| 4,674,175 * | 6/1987 | Stampfli ................................ 29/588 |
| 4,991,059 | 2/1991 | Kiyose . |
| 4,996,411 | 2/1991 | Rebjock . |
| 5,270,492 | 12/1993 | Fukui . |
| 5,367,124 * | 11/1994 | Hoffman et al. ...................... 257/660 |
| 5,421,081 | 6/1995 | Sakaguchi et al. . |
| 5,455,740 | 10/1995 | Burns . |
| 5,541,450 * | 7/1996 | Jones et al. .......................... 257/697 |
| 5,648,683 * | 7/1997 | Takahashi ............................ 257/698 |

(List continued on next page.)

FOREIGN PATENT DOCUMENTS

| | | |
|---|---|---|
| 686 462 A5 | 3/1996 | (CH) . |
| 39 12 891 A1 | 11/1990 | (DE) . |

(List continued on next page.)

OTHER PUBLICATIONS

"Short Free–Foot Design For Fine Pitch SMT Component", Technical Disclosure Bulletin, vol. 32, No. 58, Oct. 1989.

*Primary Examiner*—Alexander O. Williams
(74) *Attorney, Agent, or Firm*—Herbert L. Lerner; Laurence A. Greenberg; Werner H. Stemer

(57) ABSTRACT

A chip module has a contact area disposed on its outer side formed of a plurality of essentially flat contact elements of electrically conductive material insulated from one another. At least one semiconductor chip having one or more integrated semiconductor circuits that are electrically connected to the contact elements of the contact area via bonding wires. The contact elements of the chip module are formed by a prefabricated lead frame for supporting the at least one semiconductor chip and have on two opposing sides of the chip module outwardly offset terminals arranged in rows next to one another. The outwardly offset terminals are provided for surface mounting the chip module on the mounting surface of an external printed circuit board or an external circuit board substrate.

14 Claims, 10 Drawing Sheets

U.S. PATENT DOCUMENTS

| | | | | |
|---|---|---|---|---|
| 5,869,889 | * | 2/1999 | Chin et al. | 257/738 |
| 5,986,336 | * | 11/1999 | Tomita | 257/698 |
| 6,060,770 | * | 5/2000 | Nakamura et al. | 257/668 |
| 6,122,171 | * | 9/2000 | Akrom et al. | 361/704 |
| 6,184,580 | * | 2/2001 | Lin | 257/712 |
| 6,197,614 | * | 3/2001 | Ito | 257/691 |

FOREIGN PATENT DOCUMENTS

| | | | |
|---|---|---|---|
| 690 13 220 T2 | | 10/1994 | (DE). |
| 43 36 501 A1 | | 4/1995 | (DE). |
| 44 31 754 C1 | | 11/1995 | (DE). |
| 0 279 683 A2 | | 8/1988 | (EP). |
| 0 391 790 A1 | | 10/1990 | (EP). |
| 0 408 904 A2 | | 1/1991 | (EP). |
| 0 746 188 A1 | | 12/1996 | (EP). |
| 3-4543 | * | 1/1991 | (JP). |
| 3-24741 | * | 2/1991 | (JP). |
| 3-241765 | * | 10/1992 | (JP). |

* cited by examiner

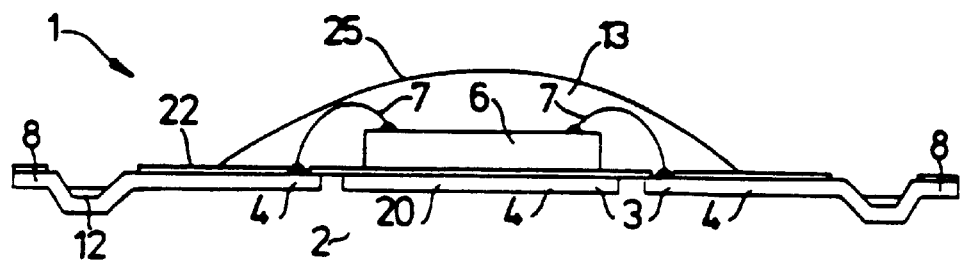
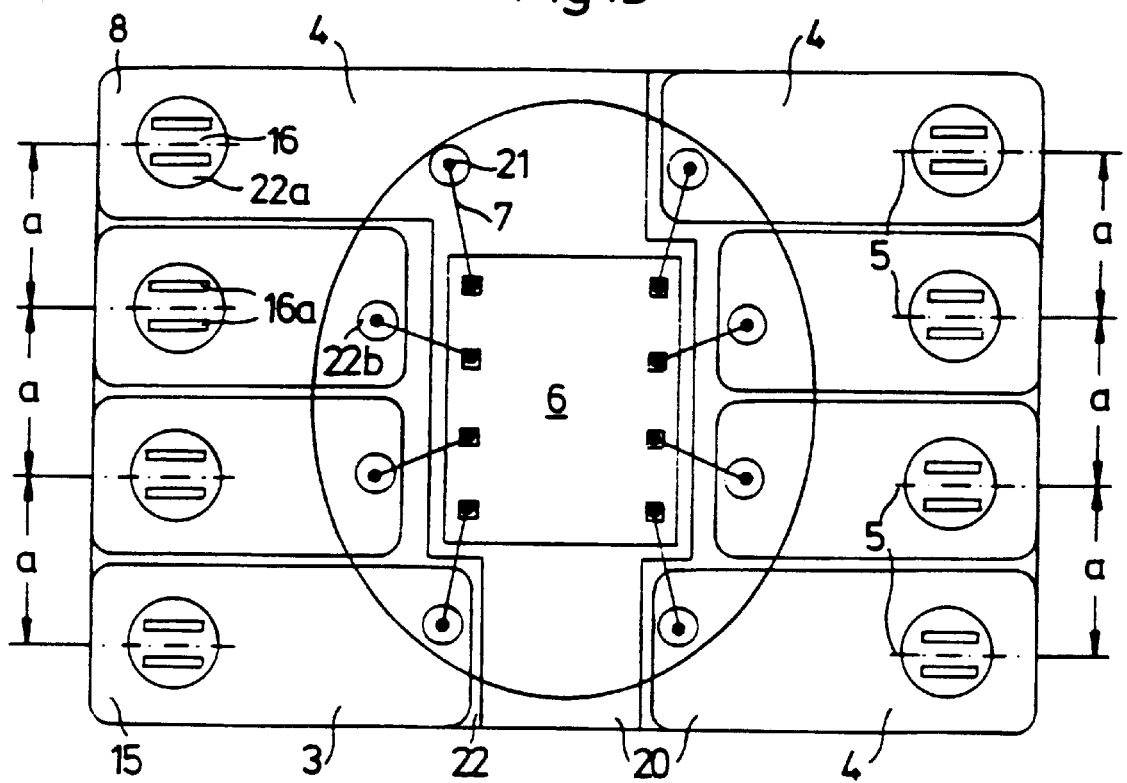

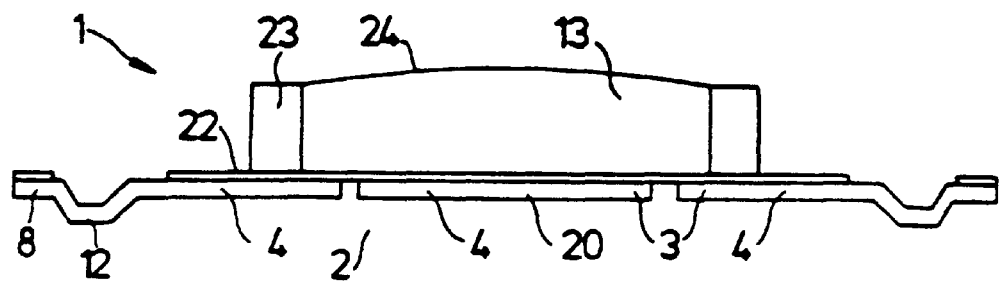
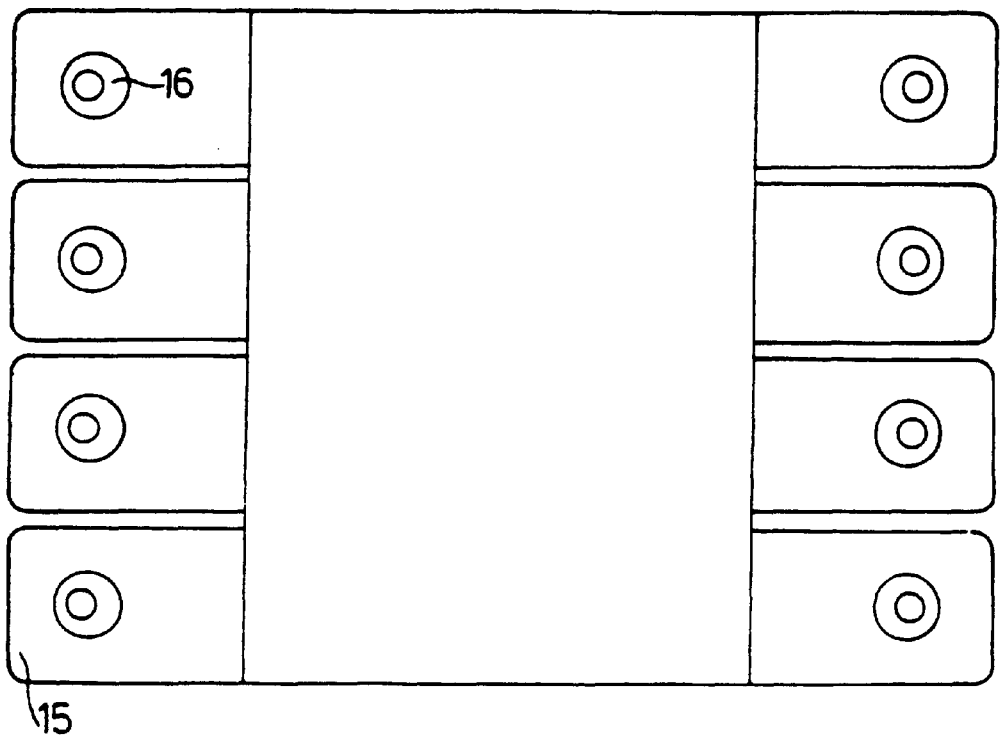

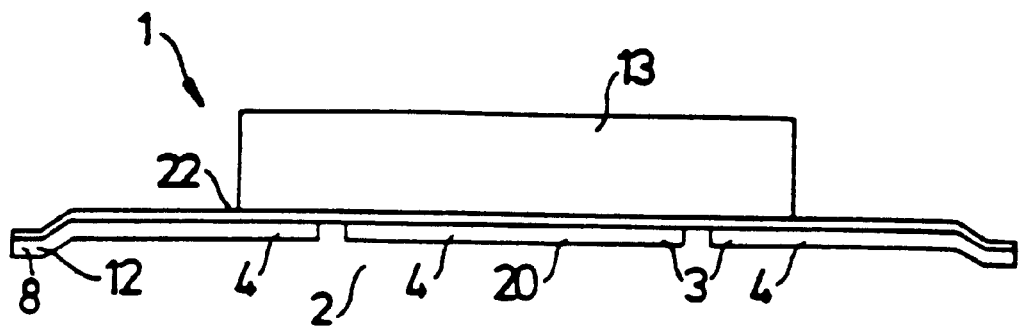
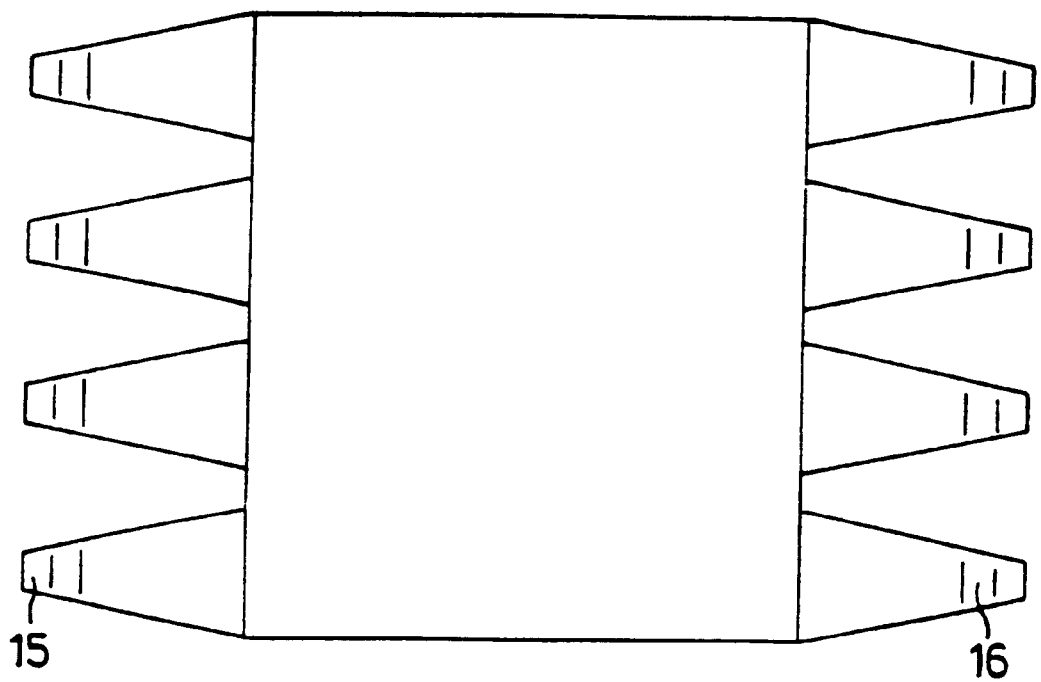

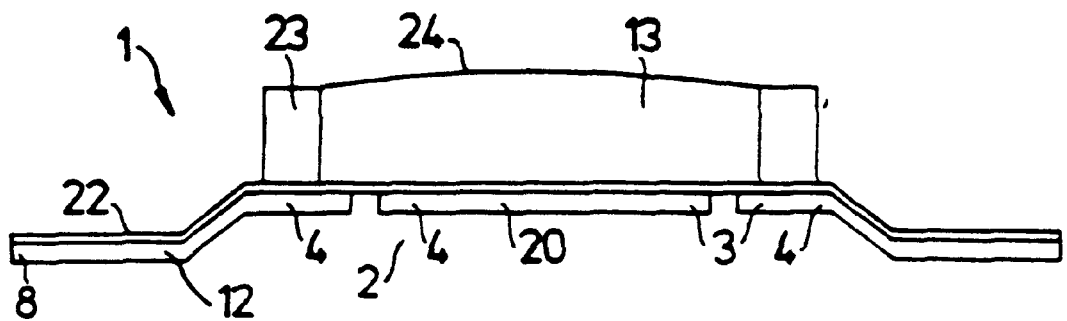
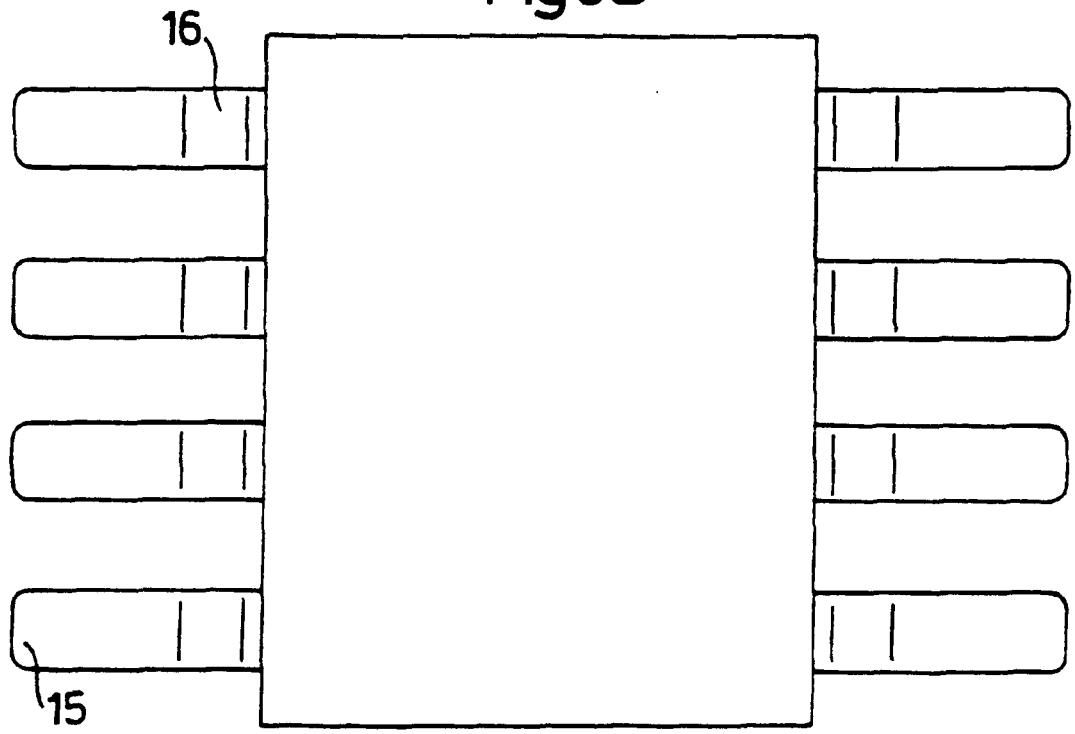

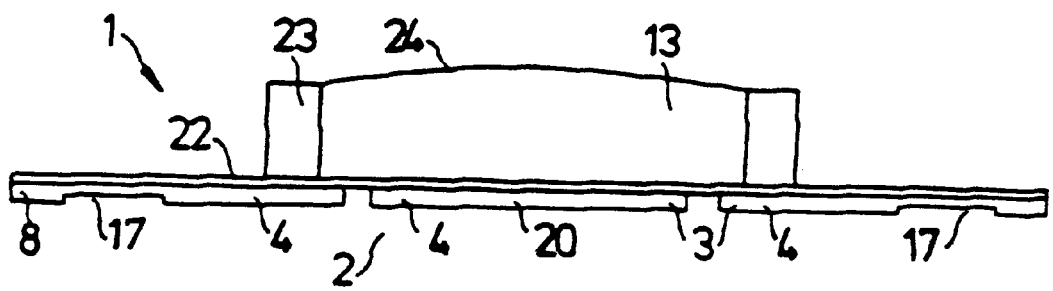
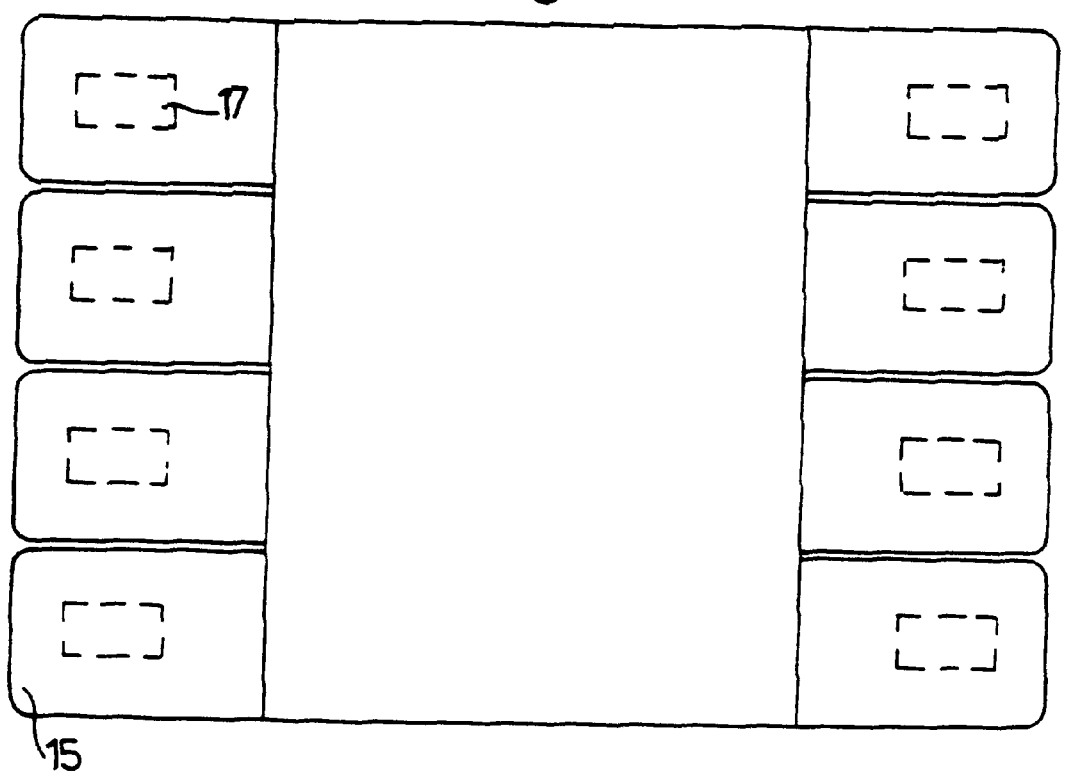

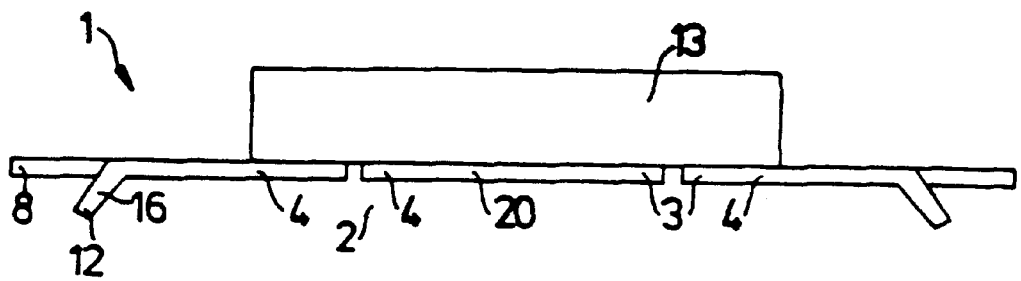
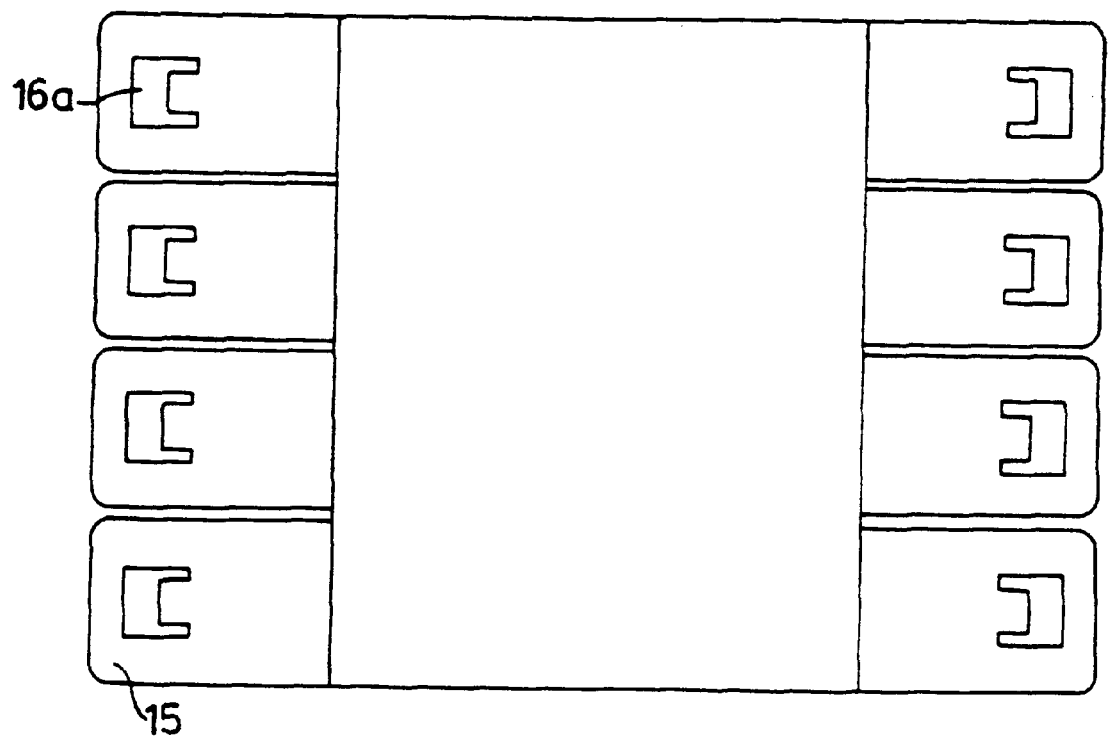

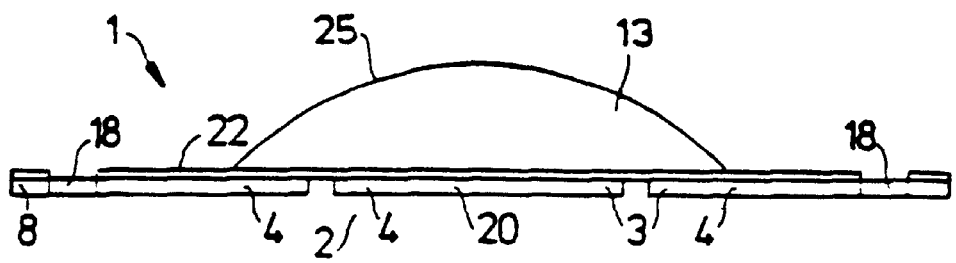
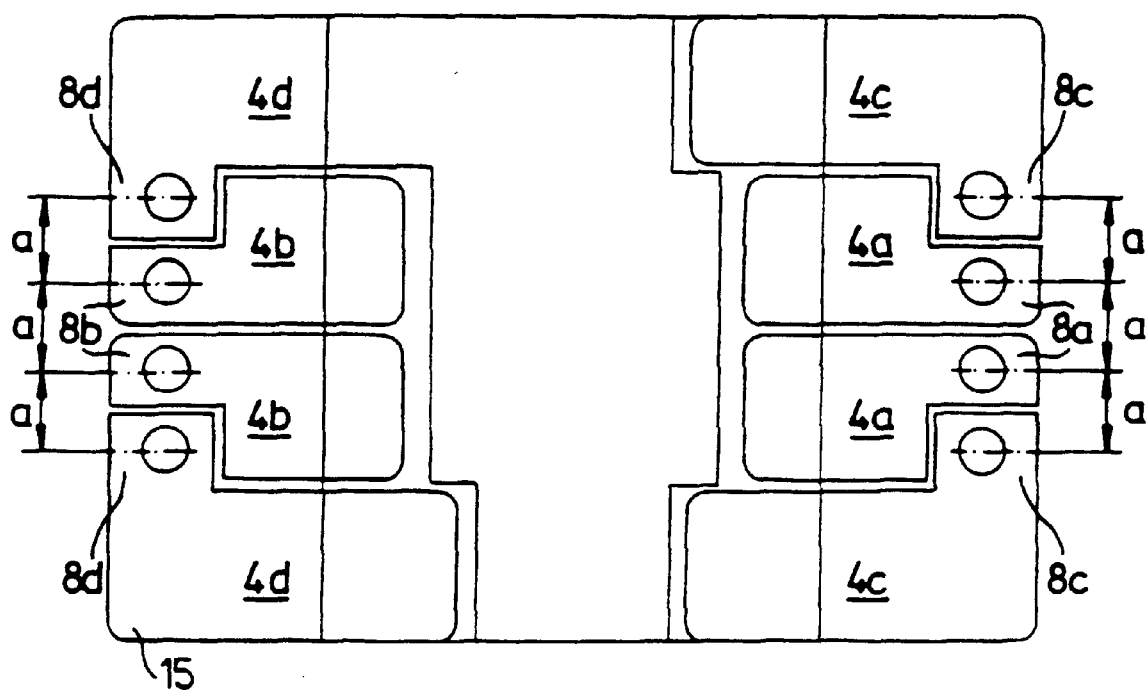

CHIP MODULE WITH A PLURALITY OF FLAT CONTACT ELEMENTS MOUNTABLE ON EITHER AN EXTERNAL PRINTED CIRCUIT BOARD OR AN EXTERNAL CIRCUIT BOARD SUBSTRATE

CROSS-REFERENCE TO RELATED APPLICATION

This application is a continuation of copending International Application No. PCT/DE97/01805, filed Aug. 21, 1997, which designated the United States.

BACKGROUND OF THE INVENTION

Field of the Invention

The invention relates to a chip module formed of a contact area having a plurality of flat contact elements of electrically conductive material that are insulated from each other. The chip module also has one or more semiconductor circuits electrically connected to the contact elements via connection terminals. The invention also relates to a method of producing such a chip module and also to the use of such chip modules in chip cards or similar data carriers, and also to the use on or in a printed circuit board or on or in a circuit board substrate.

In the production of chip cards, chip modules are produced as technically finished intermediate products and are independently processed further into final products. A chip module is understood here to be a configuration formed of a contact area having a plurality of flat contact elements of electrically conductive material that are insulated from each other. The chip module also has one or more semiconductor circuits electrically connected to the contact elements via connection terminals. The one or more integrated semiconductor circuits are disposed in a substrate in the form of chips which are connected via connection terminals to a system of conductor tracks provided on at least one side of the substrate. In the case of an already known chip module, the substrate is formed by a carrier, produced mainly from epoxy or similar plastics material, on which the actual semiconductor chip is mounted, and on which the usually gold-plated, generally six or eight contact elements are disposed on the outer side of a customary chip card with contacts of the ID-1, ID-00 or ID-000 format, via which an electrical connection to an external reading/writing station for the power supply and the data transmission to the microcontroller circuit integrated in the chip card takes (sic) place.

The position of the contact elements with respect to the chip card body and their size is laid down in International Standard ISO 7810 or ISO 7816-2. For further details and features regarding the structure and the production of a chip module and chip card, reference is hereby made expressly to the authors Wolfgang Rankl and wolfgang Effing, who wrote Handbuch der Chipkarten [Handbook of Chip Cards],Carl Hanser Verlag, 1995, ISBN 3-446-17993-3 and to the full content thereof.

On account of increasing applications relating to security in the field of chip cards, the demand for microcontrollers that meet the highest security requirements is growing. A high security level is made possible by the use of so-called cryptocontrollers, which achieve extraordinary computing performances with regard to the high-speed execution of asymmetric on-chip security algorithms by use of coprocessors. Due to the dual use of cryptocontrollers both in chip cards and on circuit boards, for example in the case of so-called PCMCIA plug-in cards, reading systems at banks and financial institutions for the electrical communication of cryptocontrollers and similar reading units, the different reliability requirements mean that different forms of housings are in use for the cryptocontroller circuits, which however entail considerable disadvantages with regard to costs and logistical expenditures because of the different production processes and the different materials.

Chip housings with surface mounting technology (SMT) capability have specially shaped terminals that permit automatic mounting and a likewise automatic soldering operation. In the case of a preferred connection technique between the semiconductor chip and a circuit board corresponding to the surface mounting technology, a soldering paste is applied to the circuit board via screen printing and subsequently the semiconductor chips, housed as surface-mounted devices, are positioned on it. For establishing the connection between the circuit board and the semiconductor chip, the circuit board is brought into an oven for melting of the solder. In this case, it must be ensured that the soldered connection is reliable and is produced at the defined points, without the solder flowing away, causing short circuits to be created or a poor contact is obtained.

In contrast to this, the currently used chip modules for chip cards have contacts of a relatively large area, which serve primarily for establishing a reliable contact with scanning points of an external reader.

It is thus necessary for different applications to provide different housings or chip carriers, which lead to an increase in production costs on account of different production processes, logistics, materials, etc. German Patent DE-A-44 31 754 C1 discloses a carrier element for incorporation into a chip card with a semiconductor chip disposed on a leadframe conductor carrier and electrically connected with its contact lugs, whereby at least the semiconductor chip and the bonding wires provided for its connection to the contact lugs are surrounded by a plastic compound such that the contact lugs emerge as a conducting connection to the semiconductor chip from the plastic compound. The contact lugs on one of the surfaces of the plastic compound form contact areas, whereby at least two of the contact lugs, in addition to the extension of the contact areas, form terminals for the ends of an antenna coil.

Published European Patent Application EP-A-0 408 904 A2 discloses a surface-mountable component with a power-high-frequency-transistor, which has a plastic form body for encapsulation of each device component, whereby the lower co-planar surfaces of the terminal areas are disposed laterally at the bottom remain free.

SUMMARY OF THE INVENTION

It is accordingly an object of the invention to provide a chip module and a method of producing a chip module that overcome the above-mentioned disadvantages of the prior art devices and methods of this general type, in which a module produced initially for chip card applications can also be further processed for use in or on an external circuit board. With the foregoing and other objects in view there is provided, in accordance with the invention, a chip module, including: a contact area formed of a lead frame having a plurality of substantially flat contact elements of an electrically conductive material, the contact elements insulated from one another and define outwardly offset terminals disposed in rows next to each other and on opposite sides; bonding wires; at least one semiconductor chip having one or more integrated semiconductor circuits electrically connected to the contact elements of the contact area via the bonding wires and supported on the lead frame; and the contact elements formed for surface mounting on a mounting surface of an external mounting device selected from the group consisting of an external printed circuit board and an external circuit board substrate, the outwardly offset terminals each having a soldering lug for a permanent connection of the contact elements on the mounting surface of the external mounting device, the soldering lug selected from the group consisting of a spacer running transversely to a plane of the contact elements, a depression formed in the outwardly offset terminals, and an opening formed in and on a side of the outwardly offset terminals facing the mounting surface of the external mounting device.

According to the invention, it is provided that the contact elements are formed for the surface mounting of the chip module on the mounting surface of an external printed circuit board or an external circuit board substrate and that they are provided with a soldering lug for the permanent connection of the chip module on the mounting surface of the external printed circuit board or the external circuit board substrate for easier positioning of the chip module on the connection pattern of the printed circuit board. The contact elements of the chip module are formed by a prefabricated lead frame for supporting the at least one semiconductor chip and, on at least two opposing sides of the chip module, by outwardly offset terminals disposed in rows next to one another for the surface mounting of the chip module on the mounting surface of an external printed circuit board or an external circuit board substrate. Such a prefabricated lead frame not only performs the purely electrical function in an advantageous way but at the same time meets the technical requirements for mounting, provides the semiconductor chip with a secure hold for the electrical bonding, simultaneously bears the terminal pads corresponding to the chip terminals and having a surface which allows good contact to be made, serves as a mechanically well-defined securing method for transporting operations and for further processing, and is also used for heat dissipation or heat distribution. On the basis of the solution according to the invention, the integrated semiconductor circuit used in a chip card module, in particular a microcontroller or cryptocontroller circuit, can be successfully used as an electronic component in just one form of housing at the same time as a device which can be surface-mounted onto the mounting surface of a circuit board, a plug-in card or similar substrate. The invention provides the below listed essential advantages over the prior art.

The chip module can be optionally used for installation in a chip card or as a surface-mountable device. This capability is established by a relatively simple additional machining step at the end of the production process of the chip module, but still able to be performed during so-called front-end production operation.

By the use of only one form of housing, the expenditure on logistics, stockkeeping, transport and the like can be distinctly reduced.

Because only one standard production process is used for a standard component, which however can be used for two completely different application areas, the production costs are significantly lower than on the basis of the previously known two different forms of housing and consequently different production technologies.

Essentially no changes are required in the production process sequence to produce the chip module also in its application as a surface-mountable device. It instead being the case that the production steps carried out previously in the module assembly are used essentially unchanged.

The chip module according to the invention has in its application as a surface-mountable device a significantly smaller overall height than the components with SMT capability previously produced separately. For use as a surface-mountable device, the chip module is suitable for all the common soldering methods, such as for example iron soldering, wave soldering and reflow soldering. In this case, the terminals for the surface mounting of the chip module can be provided with constructionally different soldering lugs according to the required quality of the SMT placement with regard to tolerances to be maintained, reliability of the soldering point, soldering methods and the like.

After the concluding shaping of the contact elements of the chip module, even if it is configured as a surface-mountable device the chip module can be further processed by the same further production steps (die bonding, wire bonding, covering or molding, electrical testing, visual inspection and similar functional tests), whereby handling and rejecting defective chip modules is made easier at the same time.

There is the possibility of using the already existing implantation techniques for the installation of the chip module into a chip card. Consequently, the previously known production technologies for the production of the chip card can continue to be used without restriction.

The geometrical configuration and size of the contact elements is (sic) governed by the ISO standard regulations, in particular ISO 7810, which are used for chip cards, but at the same time meet the requirements imposed on SMT modules with regard to an adequate solder resist barrier of the terminals, temperature resistance of the component and the like. A particularly preferred configuration is distinguished in that the contact elements of the lead frame, configured to form surface-mountable terminals, are formed such that they run parallel to one another and are at a predetermined distance from one another. The distance between the center lines corresponds to the connection pattern of the terminal points formed on the mounting surface of the external printed circuit board or the external circuit board substrate, this connection pattern being, in particular, 1.27 mm or a multiple thereof. In this way, the chip module according to the invention is also suitable for processing with automatic placement machines, which are used in surface mounted technology (SMT) in the machine assembly of miniaturized components with-typical housing designs TSOP, SOT, SO, VSO, and the like with outwardly bent-away soldering lugs at a set spacing of 1.27 mm.

In order to minimize the risk of an electrical short circuit by the use of soldering paste in the case of a surface mounting of the chip module on the connection pattern of the printed circuit board performed by soldering, it may advantageously be provided that the soldering lug of the surface-mountable terminals is formed by a spacer running transversely with respect to the plane of the contact elements.

In the case of a constructionally particularly simple chip module which can be produced at low cost, it may be provided in the case of a particularly preferred configuration of the invention that the width of the essentially rectangularly shaped surface-mountable terminals is slightly less than the connection pattern.

To protect the semiconductor chip against external mechanical and chemical influences, a chip encapsulation of electrically insulating material, reaching over the semiconductor chip, may be provided. In order that the soldering lugs to be attached preferably at the free ends of the contact elements are accessible to the tool being used here, it may be advantageously provided that the outwardly offset surface-mountable terminals of the lead frame extend beyond the chip encapsulation in the direction of the mounting plane.

The constructional configuration of the soldering lugs to be attached at the free ends of the contact elements may be configured differently according to the required quality of the surface-mountable placement with regard to tolerances to be maintained, reliability of the soldering point, soldering methods and the like. In the simplest case, the soldering lugs may be formed by a depression or opening which is provided on the side of the outwardly offset contact element facing the mounting surface of the circuit board and is preferably produced by stamping or chemical etching. Furthermore, it may be provided that the soldering lug is formed in a multiply angled shaping of the outwardly offset contact element provided with corresponding cutouts, preferably by punching and/or bending.

It is also possible that, on account of special requirements in the assembly of the chip module on a printed circuit board, the terminals or the contact elements of the module are drawn beyond the module covering. In this case, it is provided that the soldering lug is formed by an offset rising above the overall height of the chip encapsulation.

In the case of a further preferred configuration of the invention, it may be provided that the prefabricated lead frame has on its surface facing the semiconductor chip an insulation film which is provided with openings in the region of the soldering lugs and/or in the region of the connection terminals. The insulation film, preferably produced from a plastics material, favorably has in this case a thickness in the range from about 25 $\mu$m to about 200 $\mu$m. Suitable materials are, for example, epoxy resin, polyimide, polyester, polyether sulphone (PES), polyparabanic acid (PPA), polyvinyl chloride (PVC), polycarbonate, Kapton and/or acrylonitrile-butadiene-styrene copolymer (ABS) or similar high-impact thermoplastic material.

Other features which are considered as characteristic for the invention are set forth in the appended claims.

Although the invention is illustrated and described herein as embodied in a chip module and a method of producing a chip module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1C is a sectional view of a variant of the first exemplary embodiment, having the punched lead frame and the supporting carrier of globe-top construction;

FIG. 1D is a plan view of the chip module according to FIG. 1C;

FIG. 3A is a sectional view of the chip module according to a third exemplary embodiment of the invention;

FIG. 3B is a plan view of the chip module according to FIG. 3A;

FIG. 4A is a sectional view of the chip module according to a fourth exemplary embodiment of the invention;

FIG. 4B is a plan view of the chip module according to FIG. 4A;

FIG. 6A is a sectional view of the chip module according to a sixth exemplary embodiment of the invention;

FIG. 6B is a plan view of the chip module according to FIG. 6A;

FIG. 7A is a sectional view of the chip module according to a seventh exemplary embodiment of the invention;

FIG. 7B is a plan view of the chip module according to FIG. 7A;

FIG. 8A is a sectional view of the chip module according to an eighth exemplary embodiment of the invention, FIG. 8B is a plan view of the chip module according to FIG. 8A;

FIG. 9A is a sectional view of the chip module according to a ninth exemplary embodiment of the invention; and FIG. 9B is a plan view of the chip module according to FIG. 9A.

DESCRIPTION OF THE PREFERRED EMBODIMENTS

Figure 1A:
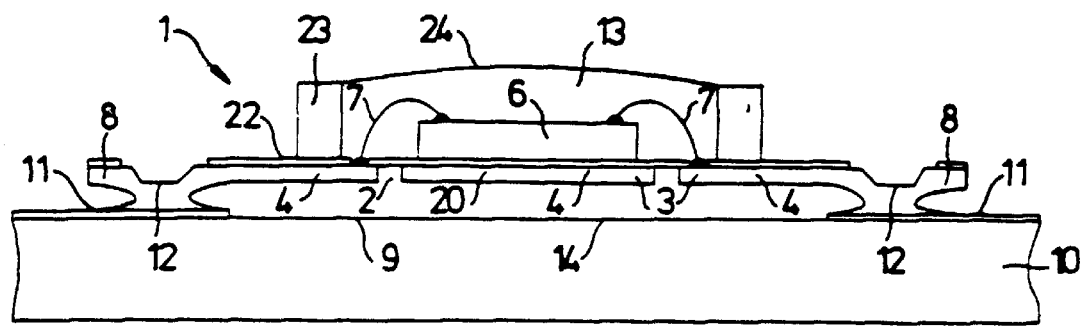
FIG. 1A is a diagrammatic sectional view of a surface-mountable chip module with a punched lead frame, having a plastic supporting carrier and a reinforcing frame covered by a globe-top covering, according to a first exemplary embodiment of the invention.
Figure 1B:
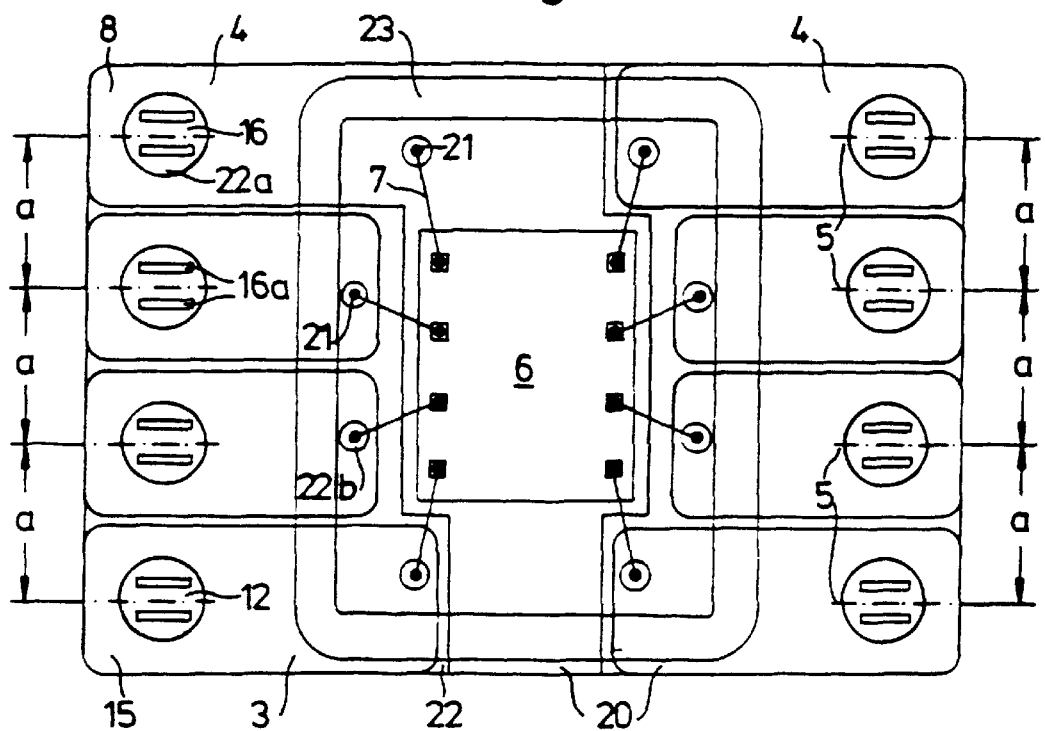
FIG. 1B is a plan view of the chip module according to FIG. 1A.
Figure 2A:
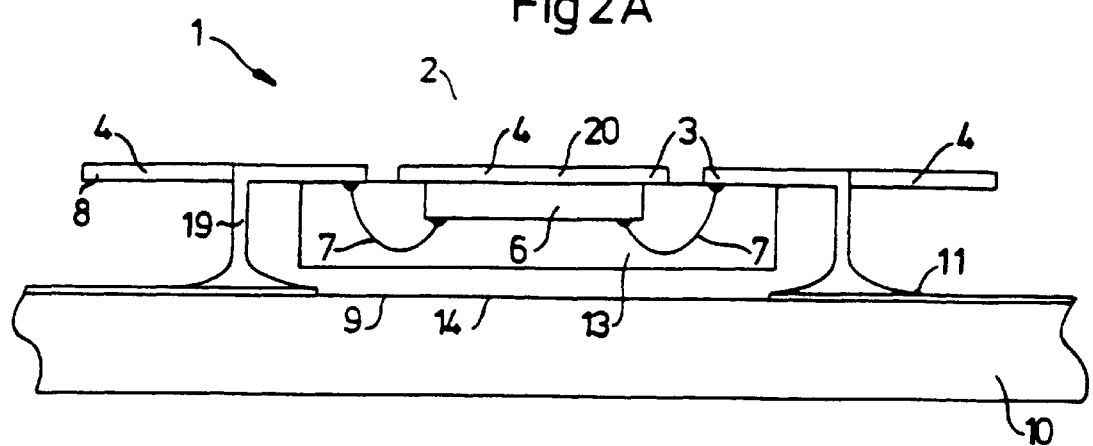
FIG. 2A is sectional view of the surface-mountable chip module, having a molded lead frame according to a second exemplary embodiment of the invention.
Figure 2B:
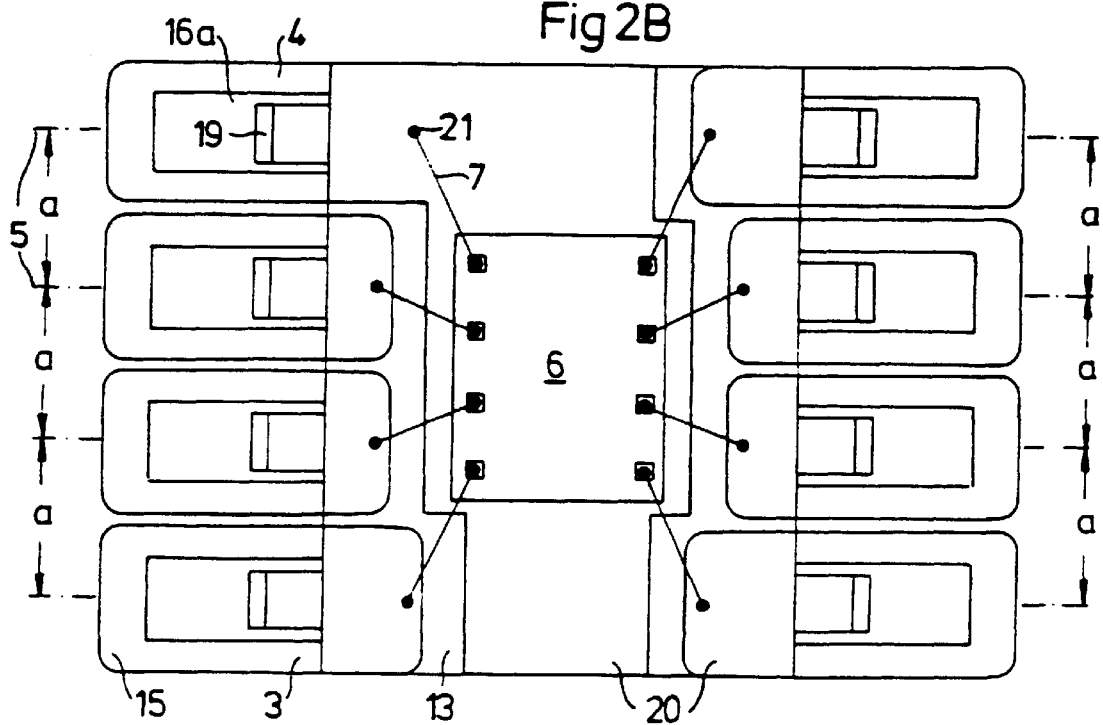
FIG. 2B is a plan view of the chip module according to FIG. 2A.
Figure 2C:
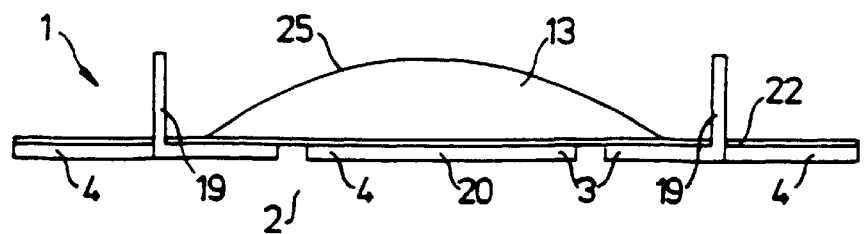
FIG. 2C is a sectional view of a second a variant of the second exemplary embodiment, having the lead frame, the plastic supporting carrier and the globe-top covering.
Figure 5A:
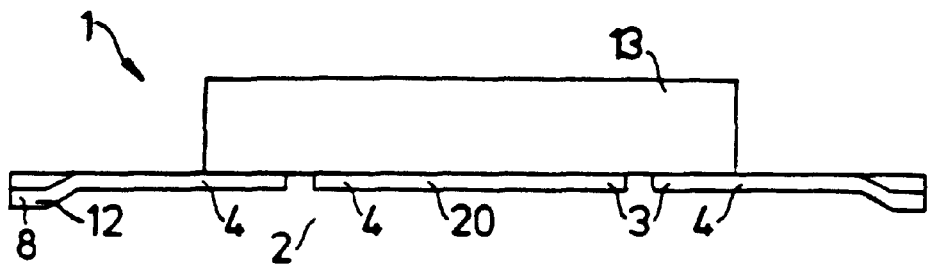
FIG. 5A is a sectional view of the chip module according to a fifth exemplary embodiment of the invention.
Figure 5B:
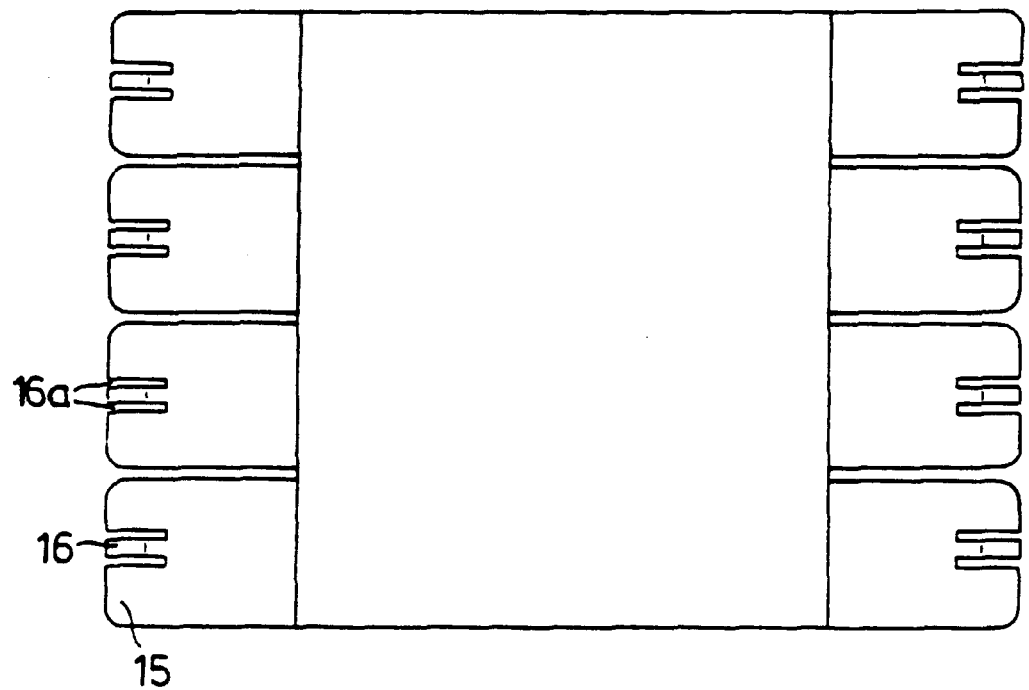
FIG. 5B is a plan view of the chip module according to FIG. 5A.

In all the figures of the drawing, sub-features and integral parts that correspond to one another bear the same reference symbol in each case. Referring now to the figures of the drawing in detail and first, particularly, to FIGS. 1A to 9B thereof, there is shown in each case a chip module 1 having a contact area 3, disposed on its outer side 2, with a plurality of mutually insulated, essentially flat contact elements 4 of an electrically conductive material, and having at least one semiconductor chip 6 with one or more integrated semiconductor circuits (not shown in any more detail in the figures). The semiconductor chip 6 is electrically connected via connection terminals in the form of bonding wires 7 to the contact elements 4 of the contact area 3. The contact elements 4 of the chip module 1 are formed on the two opposing sides of the chip module 1 by outwardly offset terminals 8 disposed in rows next to one another for the surface mounting of the chip module 1 on a mounting surface 9 of an external printed circuit board 10 or an external circuit board substrate 10. On the mounting surface 9 of the printed circuit board 10 there are disposed soldering areas 11 with a set spacing customary in surface mounted technology of 1.27 mm, which serve as terminal points for the electrical and mechanical connection of the contact elements 4 by use of common soldering methods. The contact elements 4 of the chip module 1, configured to form the surface-mountable terminals 8, are in this case formed such that they run parallel to one another and are at a predetermined distance a of their center lines 5 from one another. The distance a corresponds in turn to the connection pattern of the terminal points 11 formed on the mounting surface 9 of the printed circuit board 10, i.e. a=1.27 mm. The contact elements 4, configured to form surface-mountable terminals 8, are in each case provided with a soldering lug 12 for the permanent connection of the chip module 1 on the mounting surface 9 of the printed circuit board 10. To protect the semiconductor chip 6 against external mechanical and chemical influences, a chip encapsulation 13 of electrically insulating material, reaching over the semiconductor chip 6, is provided. All the exemplary embodiments represented in the figures share the common feature that the outwardly offset surface-mountable terminals 8 extend beyond the chip encapsulation 13 in the direction of a mounting plane 14.

The exemplary embodiments represented differ firstly with regard to the constructional configuration of the soldering lugs 12 attached at free ends 15 of the contact elements 4, which are configured differently according to the required quality of the surface-mountable placement with regard to tolerances to be maintained, reliability of the soldering point, soldering methods and the like.

The exemplary embodiments also differ in the structure and configuration of the chip encapsulation 13 protecting the semiconductor chip 6. Within the scope of the invention, any desired variation possibilities of the chip encapsulation configurations shown with possibilities shown for configuring the soldering lugs, are conceivable, with the result that the exemplary embodiments explicitly shown merely represent a selection of the variations which are conceivably possible.

In this sense, the soldering lugs 12 in the case of the exemplary embodiments according to FIGS. 1A, 1B,1C, 1D, 3A, 3B, 4A, 4B, 5A, 5B, 6A, 6B, 8A, 8B are formed by a multiply angled shaping 16 of the outwardly offset contact element 4 provided with corresponding cutouts 16a, preferably by punching and/or bending. On the other hand, the soldering lugs 12 in the case of the exemplary embodiment according to FIGS. 7A and 7B are formed by a depression 17 provided on the side of the outwardly offset contact element 4 facing the mounting surface 9 of the circuit board 10, and correspondingly in the case of the exemplary embodiment according to FIGS. 9A and 9B by an opening 18, which are preferably formed by stamping or chemical etching. In the case of the exemplary embodiment according to FIGS. 2A, 2B and 2C, the soldering lugs 12 are formed by an offset 19 rising above the overall height of the chip encapsulation 13, with the result that in the case of this, exemplary embodiment the chip module 1 can be surface-mounted with downwardly facing semiconductor chip 6 on the mounting surface 9 of the circuit board 10.

In the case of all the exemplary embodiments represented in the figures, the contact elements 4 or the terminals 8 are formed according to the invention by a prefabricated lead frame 20 of electrically conductive material. The lead frame 20 serves at the same time as a flexurally rigid substrate for supporting the semiconductor chip 6 and bears terminal pads 21 having a surface which allows good contact to be made, serving for electrical connection by the bonding wires 7. In the case of the exemplary embodiments according to FIGS. 1A, 1B, 1C, 1D, 2C, 3A, 3B, 4A, 4B, 6A, 6A (sic), 7A, 7B, 9A, 9B, the lead frame 20 is assigned an intermediate carrier, preferably produced from plastic, or a thin insulation film 22, which is provided in the region of the soldering lugs 12 and/or in the region of the terminal pads 21 with preferably punched-out openings 22a and 22b.

For the production of the chip encapsulation 13 there are likewise several possibilities within the constructional configuration of the subject-matter according to the invention. For instance, the chip encapsulation 13 may be molded by a casting compound using a suitably configured casting mould or be produced by dispensing a compound which can be cured thermally or after irradiation with UW light. Corresponding exemplary embodiments are represented in FIGS. 2A, 2B, 4A, 4B, 5A, 5B, and also 8A, 8B. On the other hand, it is similarly conceivable for producing the chip encapsulation 13 to provide the semiconductor chip 6 with a suitable prefabricated reinforcing frame 23 of plastic, which is permanently fastened on the lead frame 20, preferably by adhesion, and is subsequently closed off by a so-called globe-top covering 24 of preferably epoxy resin, a UV-curable polymer compound and the like. These variants are shown in more detail in FIGS. 1A, 1B, 3A, 3B, 6A, 6B, 7A and 7B. Furthermore, it is similarly possible to omit the reinforcing frame 23 and to envelop the semiconductor chip 6 and the bonding wires 7 directly with a globe-top covering 25. These embodiments are shown in more detail in FIGS. 1C, 1D, 2C, 9A, 9B.

In the case of the exemplary embodiment according to FIGS. 9A and 9B, the ends 15 of middle terminals 8a and 8b have a somewhat smaller width in comparison with outer terminals 8c and 8d. Furthermore, the contact elements 4a to 4d are configured at their edge regions essentially in an L-shaped manner and engaging one in the other. This configuration has the advantage that, while maintaining even relatively small set spacings a for the distance between the surface-mountable terminals 8a to 8d; the contact elements can be kept with adequately large areas in keeping with the ISO standard ISO 7810.

We claim:

1. A chip module, comprising:
   a lead frame having a plurality of substantially flat contact elements of an electrically conductive material, said contact elements insulated from one another and define outwardly offset terminals disposed in rows next to each other and on opposite sides;
   bonding wires;
   at least one semiconductor chip having one or more integrated semiconductor circuits electrically connected to said contact elements of said lead frame via said bonding wires and supported on said lead frame; and said contact elements being formed such as to be surface mountable on any mounting surface of an external mounting device selected from the group consisting of an external printed circuit board and an external circuit board substrate, said outwardly offset terminals each having a soldering lug for a permanent connection of said contact elements on the mounting surface of the external mounting device, said soldering lug selected from the group consisting of a spacer running transversely to a plane of said contact elements, a depression formed in said outwardly offset terminals, and an opening formed in and on a side of said outwardly offset terminals facing the mounting surface of the external mounting device.

2. The chip module according to claim 1, wherein said contact elements have center lines, run parallel to one another and are at a predetermined distance from one another in reference to said center lines, said predetermined distance between said center lines corresponding to a connection pattern of terminal points formed on the mounting surface of the external mounting device.

3. The chip module according to claim 2, wherein said connection pattern is 1.27 mm.

4. The chip module according to claim 2, wherein said outwardly offset terminals are rectangularly shaped surface-mountable terminals having a width slightly less than said connection pattern .

5. The chip module according to claim 1, including a chip encapsulation of an electrically insulating material disposed over at least said at least one semiconductor chip.

6. The chip module according to claim 5, wherein said outwardly offset terminals of said lead frame extend beyond said chip encapsulation in a direction of a mounting plane.

7. The chip module according to claim 1, wherein said outwardly offset terminals each have a multiply angled shaping with corresponding cutouts formed therein and said soldering lug is formed in said multiply angled shaping having said corresponding cutouts.

8. The chip module according to claim 5, wherein said chip encapsulation has an overall height and said soldering lug is an offset rising above said overall height of said chip encapsulation.

9. The chip module according to claim 1, wherein said lead frame has a surface facing said at least one semiconductor chip, and including an insulation film disposed on said surface and having openings formed therein in at least one of a region of said soldering lugs and in a region of said bonding wires.

10. The chip module according claim 5, wherein said chip encapsulation has a reinforcing frame surrounding said at least one semiconductor chip and an electrically insulating covering compound closing off said reinforcing frame and covering said at least one semiconductor chip.

11. The chip module according to claim 5, wherein said chip encapsulation is formed of a covering compound covering over at least one of said at least one semiconductor chip and said bonding wires.

12. A chip card, comprising:

chip card module, including:
  a lead frame having a plurality of substantially flat contact elements of an electrically conductive material, said contact elements insulated from one another and defining outwardly offset terminals disposed in rows next to each other and on opposite sides;
  bonding wires;
  at least one semiconductor chip having one or more integrated semiconductor circuits electrically connected to said contact elements of said lead frame via said bonding wires and supported on said lead frame; and
  said contact elements being formed such as to be surface mountable on any mounting surface of an external mounting device selected from the group consisting of an external printed circuit board and an external circuit board substrate, said outwardly offset terminals each having a soldering lug for a permanent connection of contact elements on the mounting surface of the external mounting device, said soldering lug selected from the group consisting of a spacer running transversely to a plane of said contact elements, a depression formed in said outwardly offset terminals, and an opening formed in and on a side of said outwardly offset terminals facing the mounting surface of the external mounting device.

13. A chip card, comprising:
a chip card module, including:
  a lead frame having a plurality of substantially flat contact elements of an electrically conductive material, said contact elements insulated from one another and define outwardly offset terminals disposed in rows next to each other and on opposite sides of said chip card module;
  bonding wires;
  at least one semiconductor chip having one or more integrated semiconductor circuits electrically connected to said contact elements of said lead frame via said bonding wires and supported on said lead frame; and
an external mounting device having a mounting surface and selected from the group consisting of an external printed circuit board and an external circuit board substrate, said contact elements being formed for being surface mounted on said mounting surface of said external mounting device, said outwardly offset terminals each having a soldering lug for a permanent connection of said contact elements on said mounting surface, said soldering lug selected from the group consisting of a spacer running transversely to a plane of said contact elements, a depression formed in said outwardly offset terminals, and an opening formed in and on a side of said outwardly offset terminals facing the mounting surface of the external mounting device.

14. A chip module with a semiconductor chip, comprising:
  a chip module; and
  a plurality of substantially flat contact elements being formed such as to be surface mountable on any external mounting device selected from the group consisting of an external printed circuit board and an external circuit board substrate, said contact elements are disposed in rows next to each other and said contact elements each having a soldering lug for a permanent connection of said chip module on the mounting surface of the external mounting device.

* * * * *